(12) United States Patent
Huang et al.

(10) Patent No.: US 6,337,269 B1
(45) Date of Patent: Jan. 8, 2002

(54) METHOD OF FABRICATING A DUAL DAMASCENE STRUCTURE

(75) Inventors: I-Hsiung Huang, Kao-Hsiung; Jiunn-Ren Hwang, Tai-Chung; Kuei-Chun Hung, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/885,042

(22) Filed: Jun. 21, 2001

(51) Int. Cl.$^7$ .......................................... H01L 21/4763
(52) U.S. Cl. ........................ 438/618; 438/636; 438/637; 438/638; 438/640; 438/623
(58) Field of Search ..................... 438/618, 622–629, 438/634–640

(56) References Cited

U.S. PATENT DOCUMENTS 5,468,342 A * 11/1995 Nutty et al.
6,235,628 B1 * 5/2001 Wang et al. ................ 438/638

* cited by examiner

Primary Examiner—Jey Tsai
(74) Attorney, Agent, or Firm—Winston Hsu

(57) ABSTRACT

The present invention fabricates a dual damascene structure. A passivation layer, a first dielectric layer, a second passivation layer, a second dielectric layer, a third passivation layer and a third dielectric layer are formed on the surface of the semiconductor wafer followed by etching the third dielectric layer to form a pattern of an upper trench of the dual damascene structure. Then the third passivation layer and the second dielectric layer are etched down to the surface of the second passivation layer so as to form a pattern of a via hole of the dual damascene structure. Thereafter, the third passivation layer and the second passivation layer not covered by the third dielectric layer and the second dielectric layer are removed. The third dielectric layer and the second passivation layer are used as hard masks to remove the second dielectric layer and the first dielectric layer until the surface of the first passivation layer. Finally, the second passivation layer and the first passivation layer not covered by the second dielectric layer and the first dielectric layer are removed to the surface of the conductive layer so completing the process of fabricating the dual damascene structure.

18 Claims, 11 Drawing Sheets

METHOD OF FABRICATING A DUAL DAMASCENE STRUCTURE

BACKGROUND OF THE INVENTION

1. Field of the Invention

The present invention relates to a method of fabricating a dual damascene structure on a surface of a semiconductor wafer.

2. Description of the Prior Art

A dual damascene process is a method of forming a conductive wire coupled with a plug. The dual damascene structure is used to connect devices and wires in a semiconductor wafer and functions as an insulator from other devices using surrounding inter-layer dielectrics (ILD). The dual damascene structure is widely applied in the manufacturing process of integrated circuits. Thus, advancement in integrated circuit technology makes yield improvement of the dual damascene structure an important issue in the manufacturing process of integrated circuits.

Please refer to FIG. 1 to FIG. 5 of cross-sectional views of a dual damascene structure 36 manufactured by a via-first dual damascene process according to the prior art. As shown in FIG. 1, a semiconductor wafer 10 comprises a substrate 12, a conductive layer 14 positioned on a surface of the substrate 12 in a predetermined area, a passivation layer 16 composed of silicon nitride horizontally covering the substrate 12 and the conductive layer 14, a first dielectric layer 18 composed of silicon oxide covering the passivation layer 16 and a second dielectric layer 20 composed of silicon oxide covering the first dielectric layer 18. The passivation layer 16, the first dielectric layer 18 and the second dielectric layer 20 can be respectively deposited by a plasma-enhanced chemical vapor deposition (PECVD) method.

As shown in FIG. 1, the prior art method of fabricating a dual damascene structure 36 is to first uniformly coat a first photoresist layer 22 on a surface of the second dielectric layer 20 using a lithography process. An opening 24 extending to the surface of the second dielectric layer 20 is formed in a predetermined area of the first photoresist layer 22 directly above the conductive layer 14, and the opening 24 is used to define a via pattern. Then, as shown in FIG. 2, an anisotropic dry etching process is performed to vertically remove the second dielectric layer 20 and the first dielectric layer 18 not covered by the first photoresist layer 22 along the opening 24 so as to form a hole 26 extending to a surface of the passivation layer 16. Thereafter, a photoresist stripping process is performed to completely remove the first photoresist layer 22.

As shown in FIG. 3, another lithography process is performed uniformly coating a second photoresist layer 28 over the second dielectric layer 20. The second photoresist layer 28 is a positive photoresist and fills the hole 26. As shown in FIG. 4, in exposure and development processes performed on the semiconductor wafer 10, parallel lights 30 from a light source pass through a mask 32 mainly composed of glass to the photoresist layer 28 composed of photo-sensitive material so as to transfer patterns of the mask 32 to the second photoresist layer 28. Since the second photoresist layer 28 is composed of a positive photoresist layer, a portion of the second photoresist layer 28 that is exposed to light decomposes to form a structure that is soluble in developer solution. Then an alkaline solution such as sodium hydroxide (NaOH) or potassium hydroxide (KOH) is used as a developer solution to remove the developed photoresist layer by a neutralization reaction. As shown in FIG. 5, a line-opening is formed on the second photoresist layer 28 after the exposure and development processes, which is used to define the pattern of wiring lines connecting between each device.

The prior art method of fabricating a dual damascene structure 36 on a semiconductor wafer 10 proceeds an exposure and development process by placing the semiconductor wafer 10 in a photolithography apparatus so as to define wiring line patterns. As the semiconductor process becomes more and more delicate, the aspect ratio of void 26 is great so the photoresist layer filling in a bottom of void 26 does not easily receive sufficient light irradiation. Therefore, the portion of positive photoresist does not decompose to form a structure soluble in developer solution, so the photoresist layer in the bottom of void 26 can not be neutralized with developer solution to be completely removed in a subsequent photoresist removing process. This residual photoresist 29 in the bottom of void 26 may cause polymer aggregating in corners in the subsequent etching process, which results in a via open issue of the fabricated via hole and influences the electrical performance of the hole semiconductor integrated circuit.

SUMMARY OF THE INVENTION

It is therefore a primary objective of this invention to provide a method for fabricating a dual damascene structure on a surface of a semiconductor wafer so as to solve the above-mentioned problem of residual photoresist and improve product yield.

In a preferred embodiment of the present invention a first passivation layer, a first dielectric layer, a second passivation layer, a second dielectric layer, a third passivation layer and a third dielectric layer are formed respectively on a surface of the semiconductor wafer followed by etching of the third dielectric layer to form a pattern of an upper trench of the dual damascene structure. Then the third passivation layer and the second dielectric layer are etched down to a surface of the second passivation layer to form a pattern of a via hole of the dual damascene structure. Thereafter, the third passivation layer and the second passivation layer not covered by the third dielectric layer and the second dielectric layer are removed. The third dielectric layer and the second passivation layer are used as hard masks to remove the second dielectric layer and the first dielectric layer to the surface of the first passivation layer. Finally, the second passivation layer and the first passivation layer not covered by the second dielectric layer and the first dielectric layer are removed to a surface of the conductive layer so completing the process of fabricating the dual damascene structure.

The present invention firstly uses photoresist layers to define an upper trench pattern and a via hole pattern of the dual damascene structure respectively in a dielectric layer and in a passivation layer. Then the dielectric layer and the passivation layer are used as hard masks to perform an etching process simultaneously forming the position of wiring lines and contact plugs. Therefore, the problem of a residual photoresist layer in the bottom of the via hole according to the prior art method does not occur, so process efficiency and throughput is improved.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
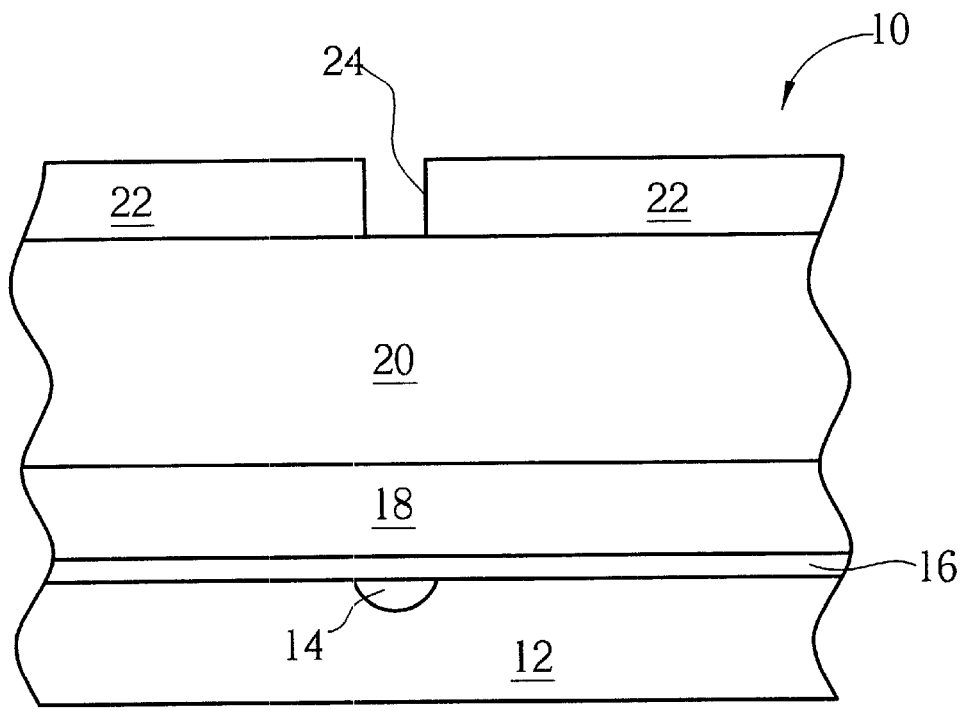
FIG. 1 to FIG. 5 are schematic diagrams showing a prior art process of fabricating a dual damascene structure.
Figure 2:
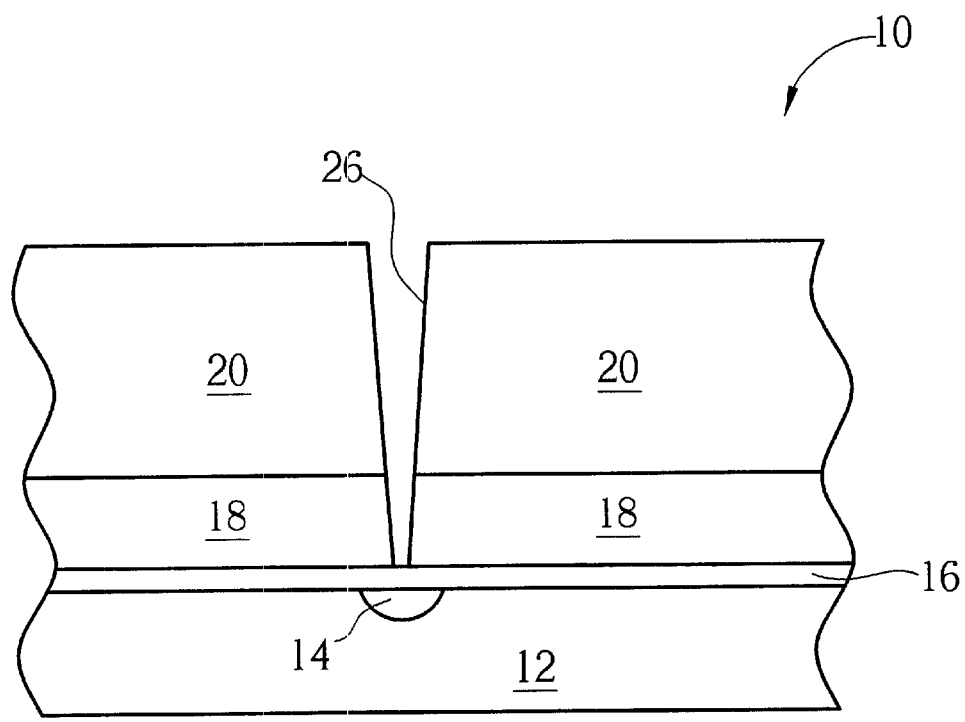
Figure 3:
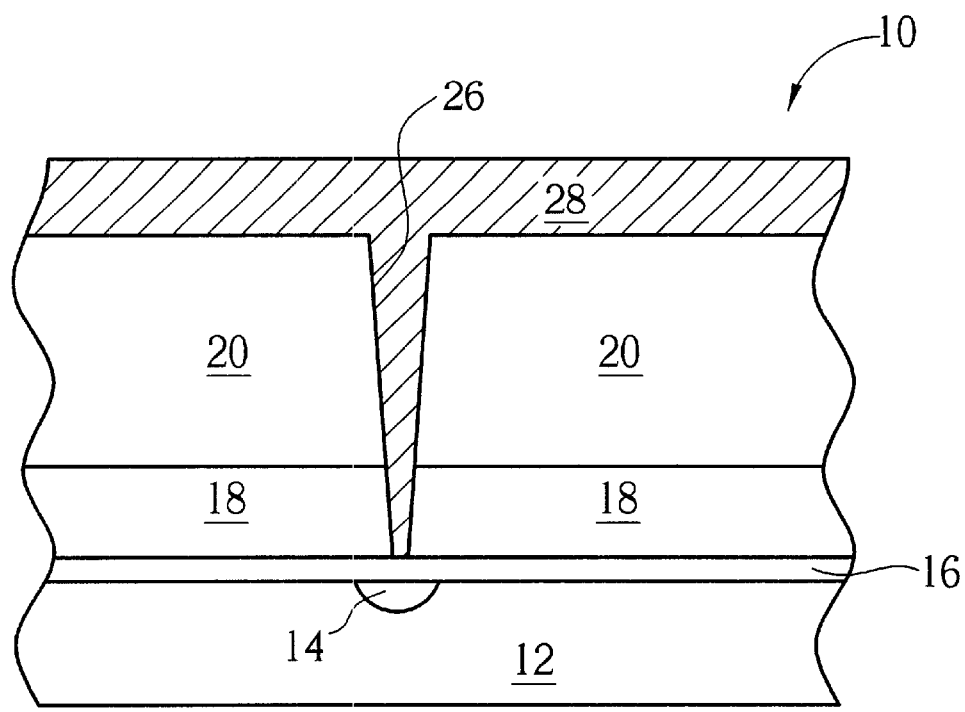
Figure 5:
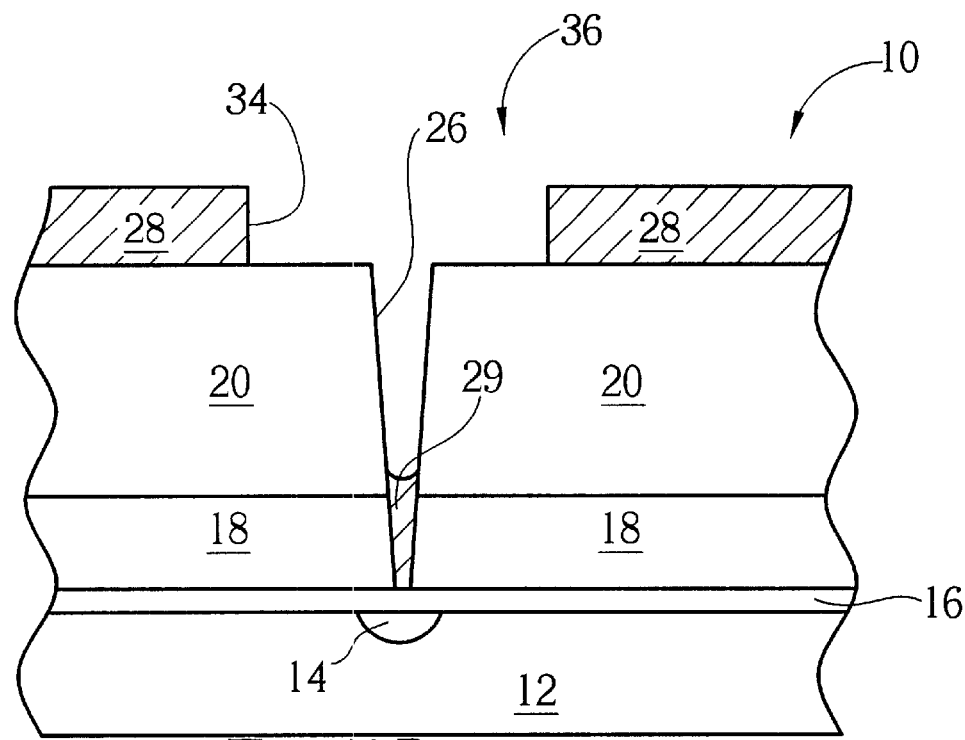
Figure 4:
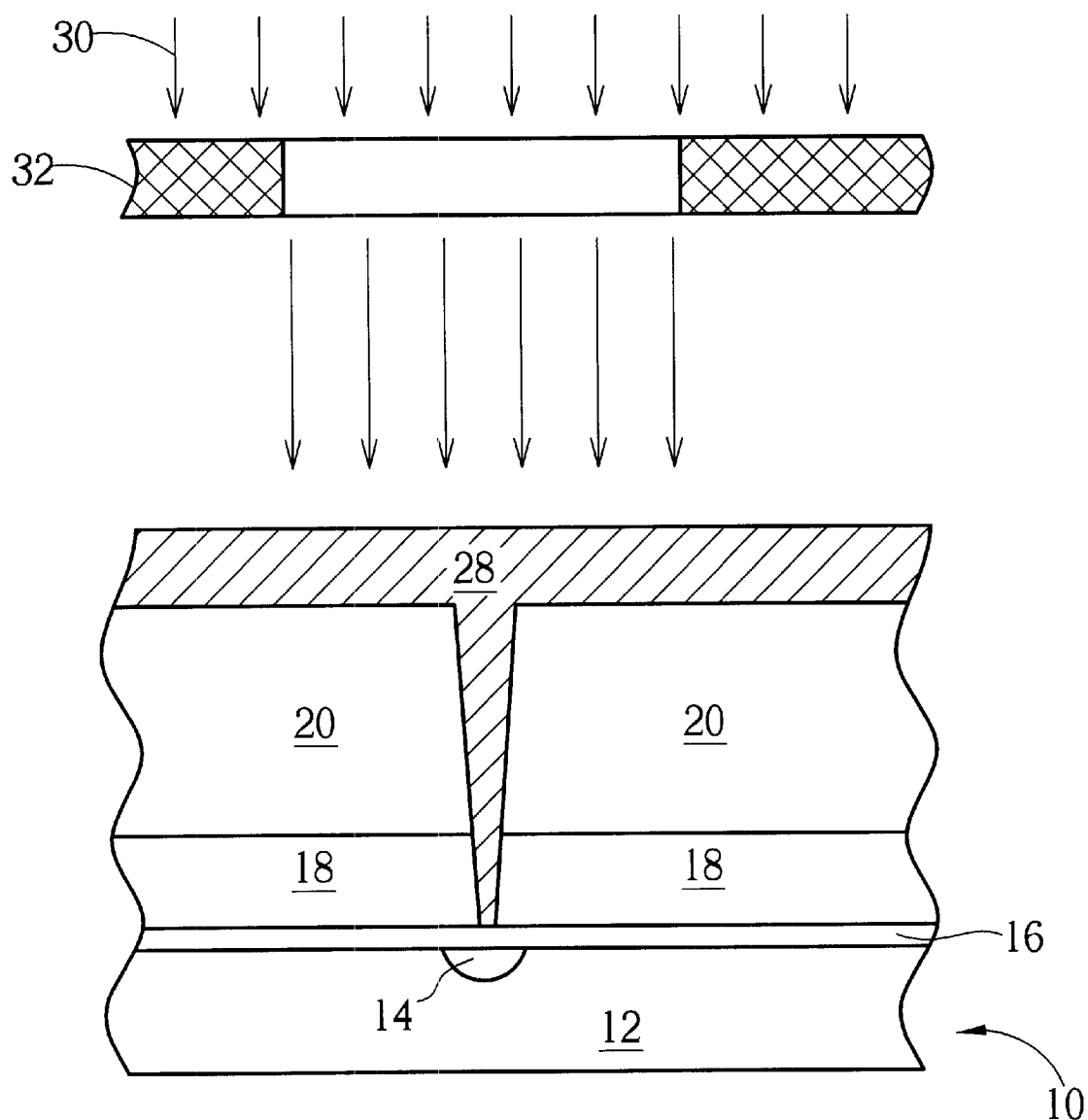
Figure 6:
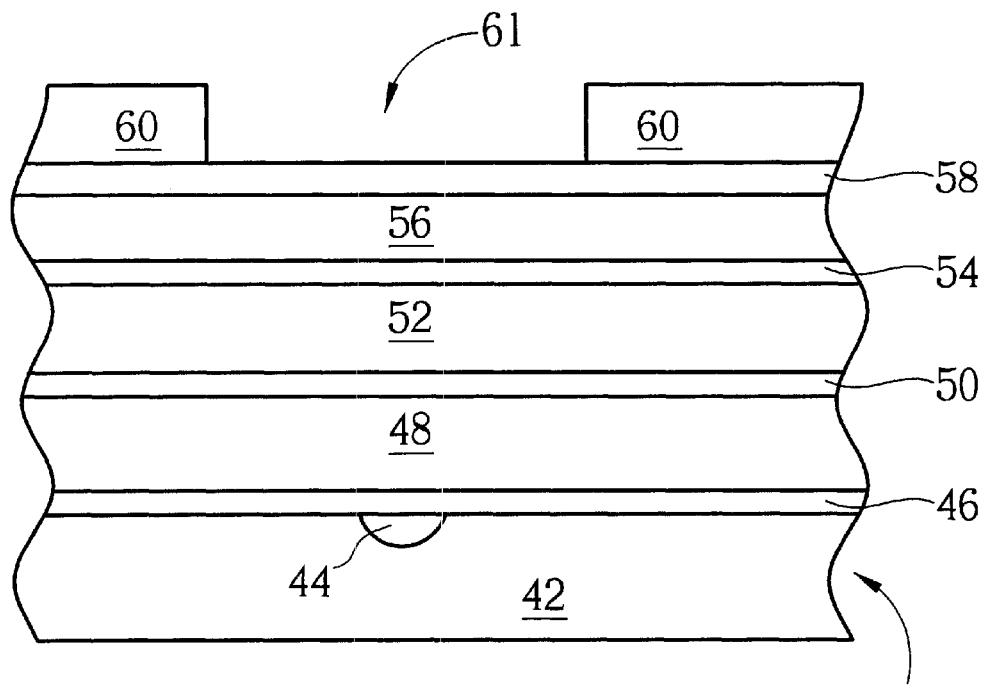
FIG. 6 to FIG. 13 are schematic diagrams of a first embodiment of fabricating a dual damascene structure on a semiconductor wafer according to the present invention.

Please refer to FIG. 6 to FIG. 13 of schematic diagrams of a first embodiment of fabricating a dual damascene structure on the surface of a semiconductor wafer 40 according to the present invention. The semiconductor wafer 40 comprises a substrate 42 and a conductive layer 44, which is composed of a copper conductor and positioned on the substrate 42. The present invention firstly forms a first passivation layer 46, a first dielectric layer 48, a second passivation layer 50, a second dielectric layer 52, a third passivation layer 54, a third dielectric layer 56 and a first anti-reflection layer 58 respectively on the semiconductor wafer 40 and covering the conductive layer 44. The first and second passivation layer 46, 50 are both composed of silicon nitride, silicon-oxy-nitride or silicon carbon. The first dielectric layer 48 or the second dielectric layer 52 is composed of a low-K material comprising FLARE™, SiLK™, poly (arylene ether) polymer, parylene compounds, polyimide, fluorinated polyimide, hydrogen silsesquioxane (HSQ), fluorinated silicon glass (FSG), silicon dioxide, nanoporous silica or teflon. The third dielectric layer 56 and the third passivation layer 54 are respectively composed of silicon oxide compounds and silicon nitride.

Figure 7:
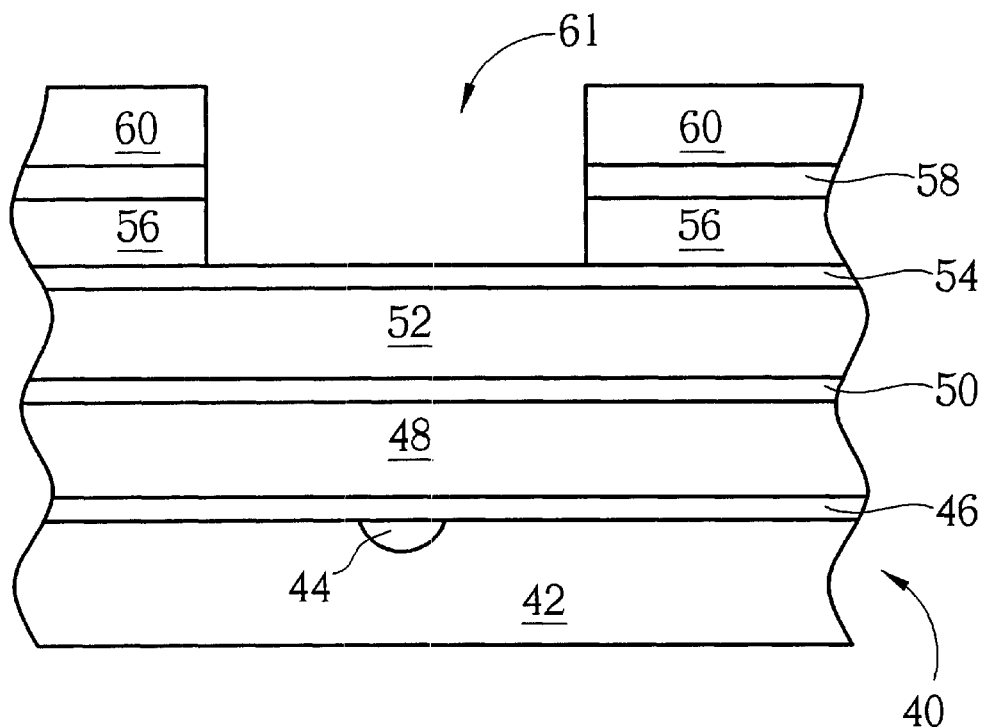

Then a lithography process is performed to form a first photoresist layer 60 on a surface of a first anti-reflecting layer 58 for defining a pattern of an upper trench 61 of the dual damascene structure. Thereafter, a first etching process is performed according to the pattern of the first photoresist layer 60 to remove the first anti-reflecting layer 58 and the third dielectric layer 56 not covered by the first photoresist layer 60 to a surface of the third passivation layer 54, as shown in FIG. 7.

Figure 8:
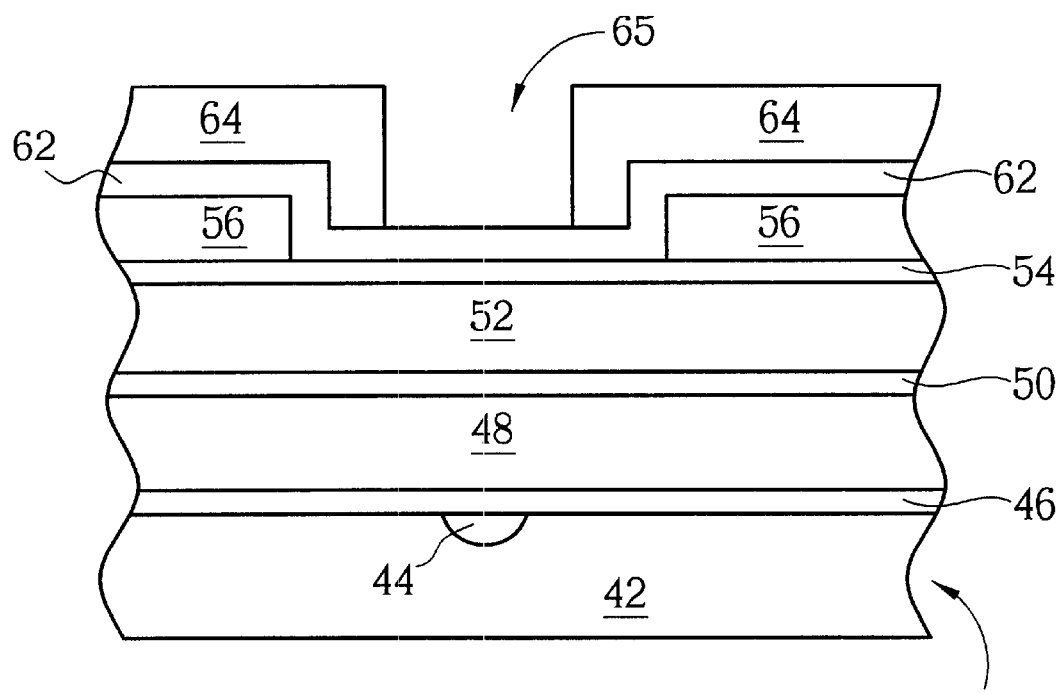
Figure 9:
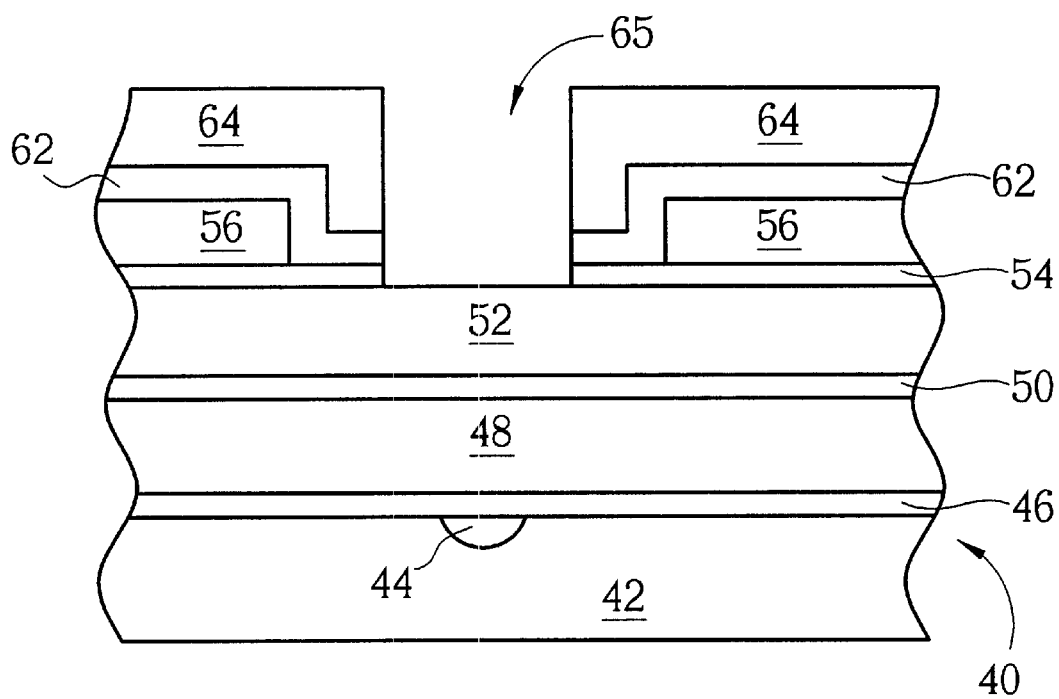

As shown in FIG. 8, the first photoresist layer 60 and the first anti-reflecting layer 58 are removed and a second anti-reflecting layer 62 is formed on a surface of the semiconductor wafer 40. Then a second lithography process is performed to form a second photoresist layer 64 on the second anti-reflecting layer 62 for defining a pattern of a via hole 65 of the dual damascene structure. As shown in FIG. 9, a second etching process is performed according to the pattern of the second photoresist layer 64 to remove the second anti-reflecting layer 62 and the third passivation layer 54 not covered by the second photoresist layer 64 to a surface of the second dielectric layer 52.

Figure 10:
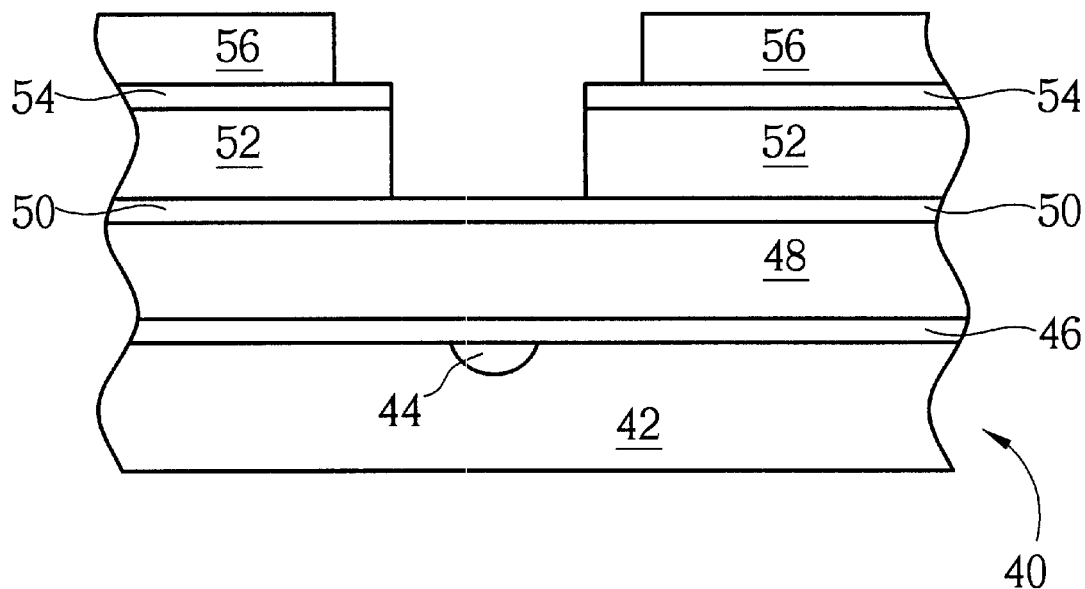
Figure 11:
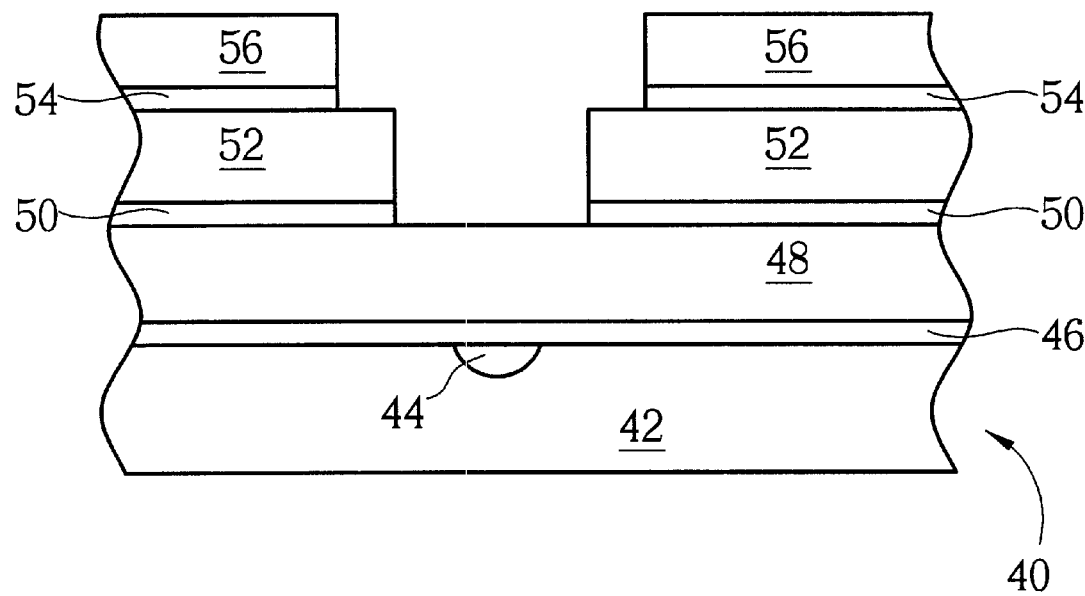

As shown in FIG. 10, the second photoresist layer 64 and the second anti-reflecting layer 62 are removed. Then a third etching process using the third dielectric layer 56 and the third passivation layer 54 as hard masks is performed to remove the second dielectric layer 52 not covered by the third dielectric layer 56 and the third passivation layer 54 to a surface of the second passivation layer 50. As shown in FIG. 11, a forth etching process is performed to remove the third passivation layer 54 and the second passivation layer 50 not covered by the third dielectric layer 56 and the second dielectric layer 52.

Figure 12:
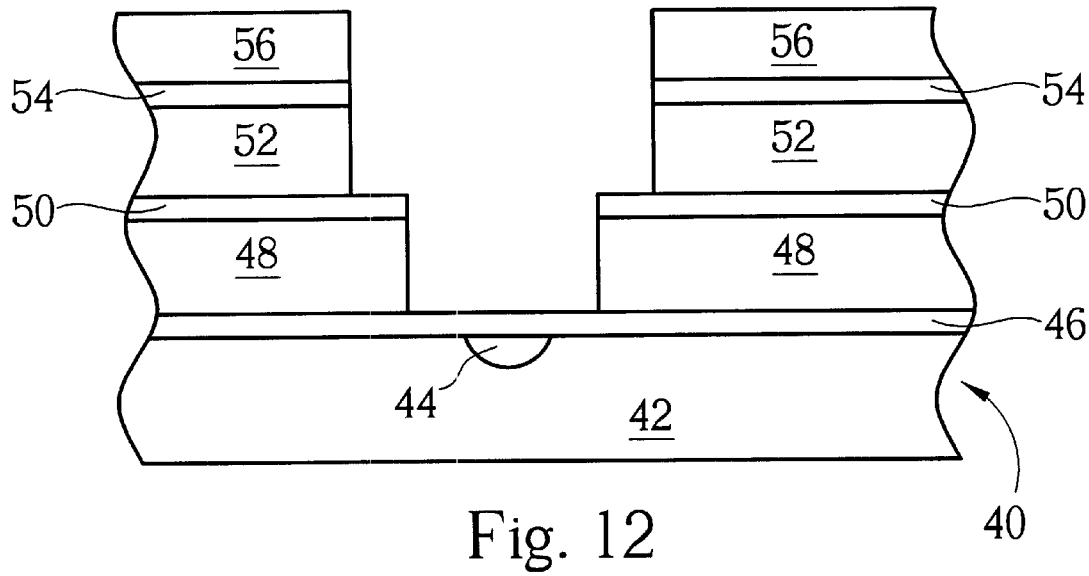
Figure 13:
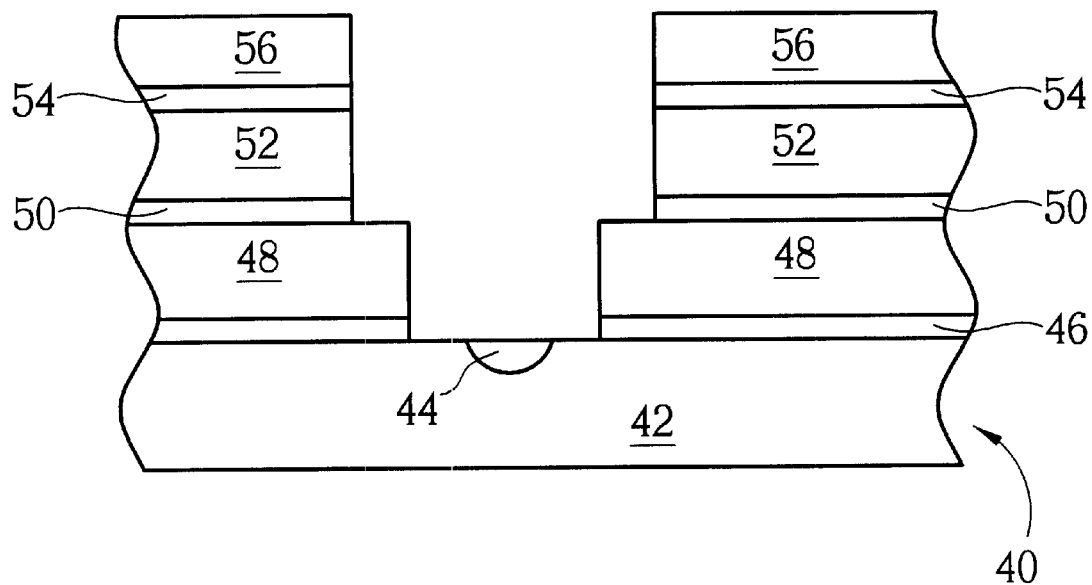

As shown in FIG. 12, a fifth etching process using the third dielectric layer and the second passivation layer as hard masks is performed to remove the second dielectric layer 52 and the first dielectric layer 48 not covered by the third dielectric layer 56 and the second passivation layer 50 to a surface of the first passivation layer 46. Finally, a sixth etching process is performed to remove the second passivation layer 50 and the first passivation layer 46 not covered by the second dielectric layer 52 and the first dielectric layer 48 to a surface of the conductive layer 44 so completing the process of fabricating the dual damascene structure.

In the first embodiment according to the present invention, the third dielectric layer 56 and the third passivation layer 54 are also respectively composed of silicon-oxy-nitride and silicon carbon. Since silicon-oxy-nitride has good reflectivity, the first and second anti-reflecting layer 58, 62 are not necessary in the process so reducing process cost.

Figure 14:
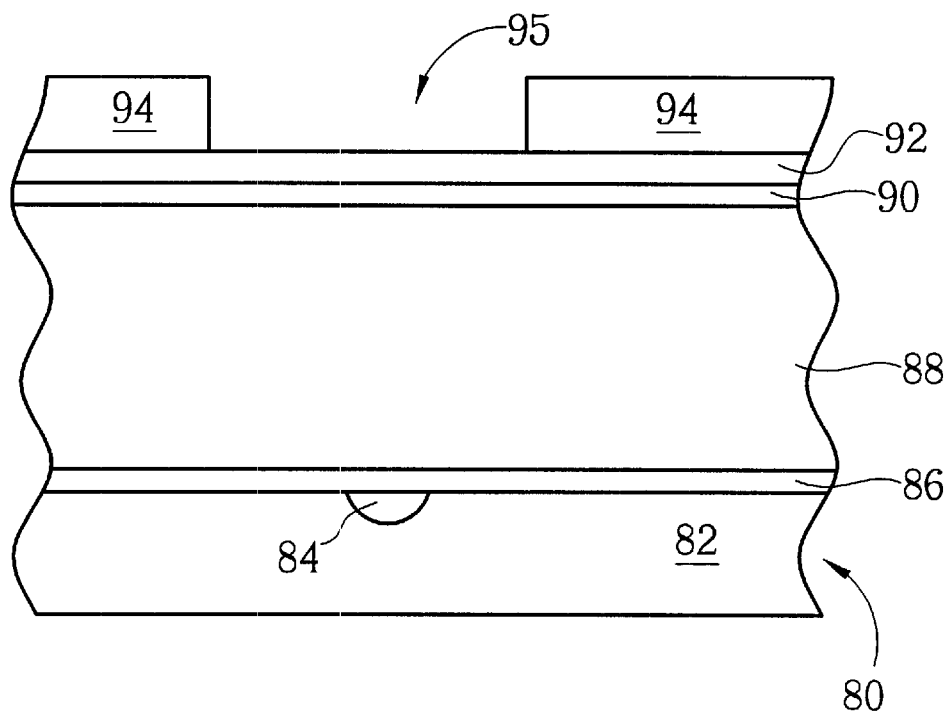
FIG. 14 to FIG. 20 are schematic diagrams of a second embodiment of fabricating a dual damascene structure on a semiconductor wafer according to the present invention.

Please refer to FIG. 14 to FIG. 20 of schematic diagrams of a second embodiment of fabricating a dual damascene structure on a surface of a semiconductor wafer 80 according to the present invention. As shown in FIG. 14, the semiconductor wafer 80 comprises a substrate 82 and a conductive layer 84, which is composed of a copper conductor and positioned on the substrate 82. The present invention first forms a first passivation layer 86, a dielectric layer 88, a second passivation layer 90 and an anti-reflection layer 92 respectively on the semiconductor wafer 80 and covering the conductive layer 84. The first passivation layer 86 is composed of silicon nitride or silicon carbon. The anti-reflecting layer 92 is composed of silicon-oxy-nitride. The second passivation layer 90 is composed of silicon carbon. The dielectric layer 88 is composed of a low-K material comprising FLARE™, SiLK™, poly(arylene ether) polymer, parylene compounds, polyimide, fluorinated polyimide, hydrogen silsesquioxane (HSQ), fluorinated silicon glass (FSG), silicon dioxide, nanoporous silica or teflon.

Figure 15:
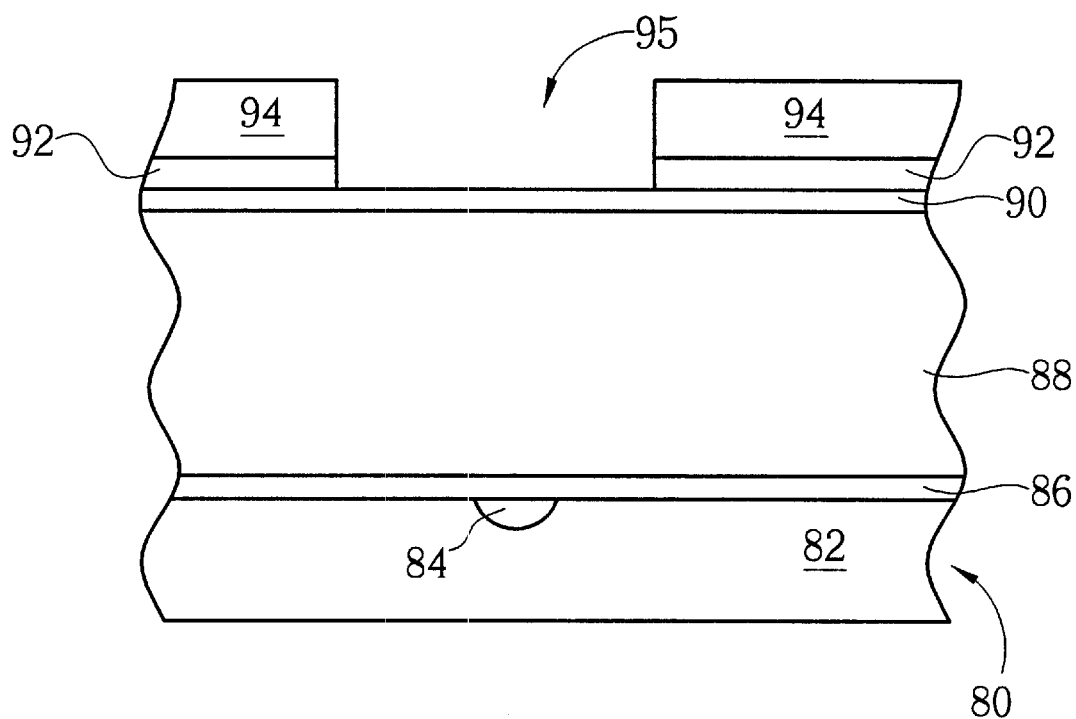
Figure 16:
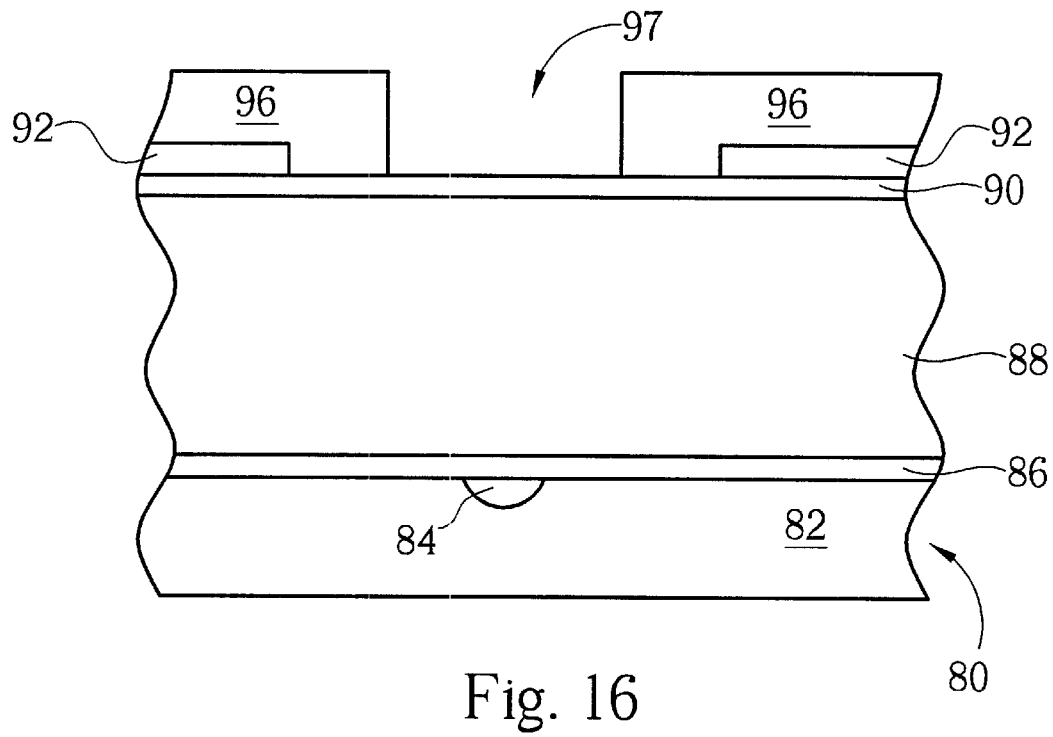

Then a first lithography process is performed to form a first photoresist layer 94 on a surface of the anti-reflecting layer 92 for defining a pattern of an upper trench 95 of the dual damascene structure. As shown in FIG. 15, a first etching process is performed according to the pattern of the first photoresist layer 94 to remove the anti-reflecting layer 92 not covered by the first photoresist layer 94 to a surface of the second passivation layer 90. Thereafter, the first photoresist layer 94 is removed followed by performing a second lithography process to form a second photoresist layer 96 on a surface of the semiconductor wafer 80 for defining a pattern of a via hole 97 of the dual damascene structure, as shown in FIG. 16.

Figure 17:
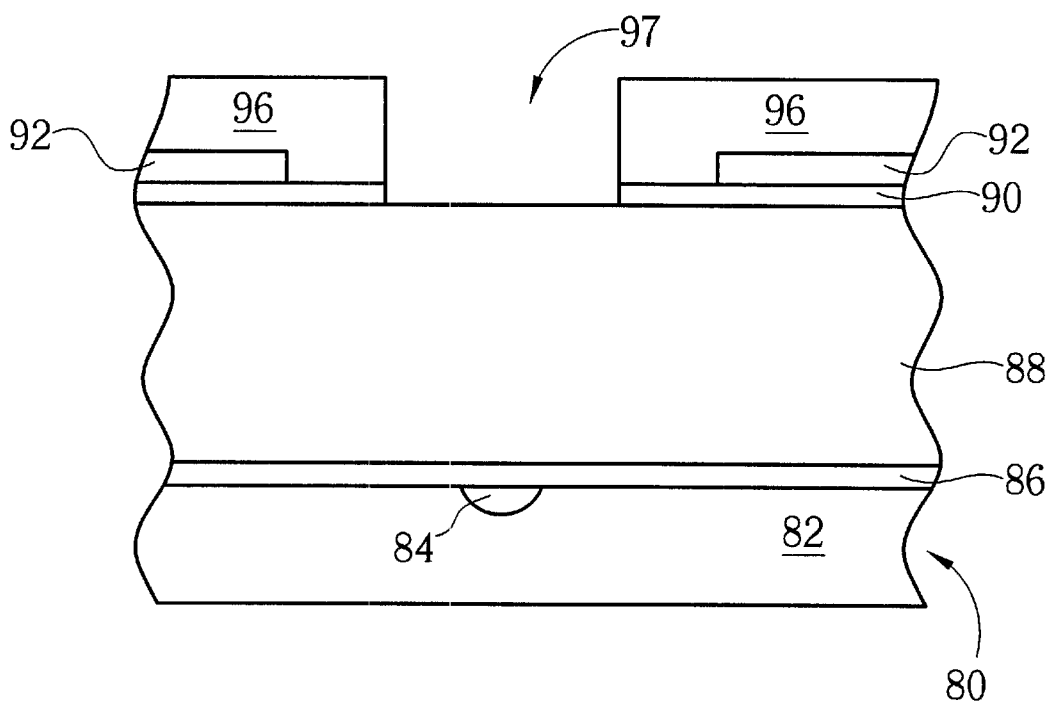
Figure 18:
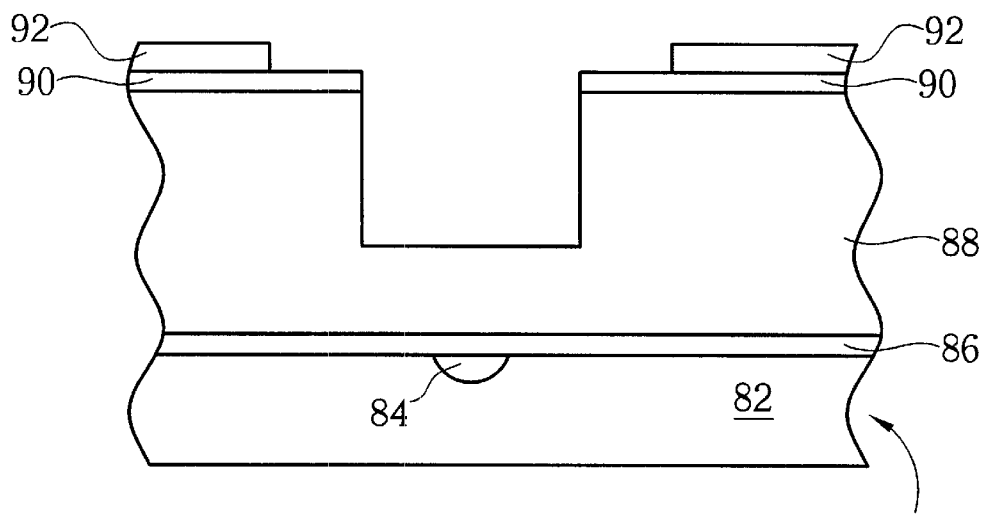

As shown in FIG. 17, a second etching process is performed according to the pattern of the second photoresist layer 96 to remove the second passivation layer 90 not covered by the second photoresist layer 96 to a surface of the dielectric layer 88. Then the second photoresist layer 96 is removed, and a third etching process using the anti-reflecting layer 92 and the second passivation layer 90 as hard masks is performed to remove the dielectric layer 88 not covered by the anti-reflecting layer 92 and the second passivation layer 90 to a predetermined depth, as shown in FIG. 18.

Figure 19:
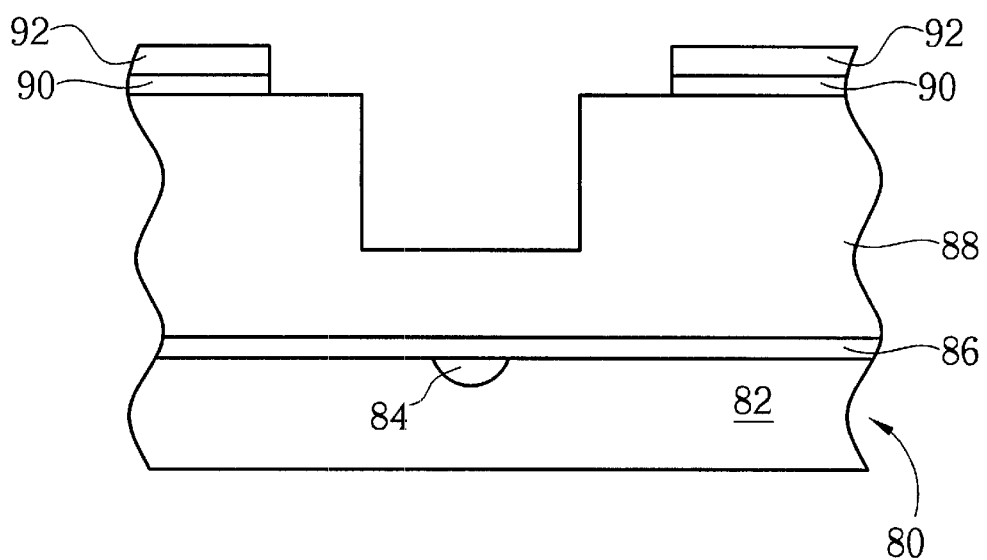
Figure 20:
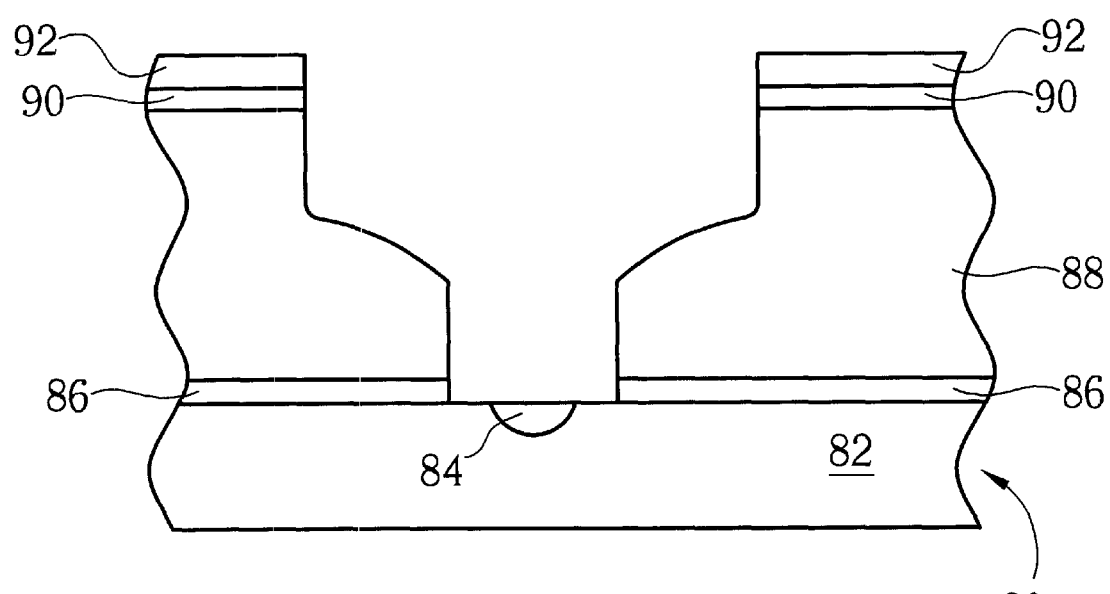

Thereafter, as shown in FIG. 19, a forth etching process is performed to remove the second passivation layer 90 not covered by the anti-reflecting layer 92. As shown in FIG. 20, a fifth etching process using the anti-reflecting layer 92 as hard mask is performed to remove portions of the dielectric layer 88 not covered by the anti-reflecting layer 92 to a surface of the first passivation layer 86 so forming the dual damascene structure. Finally, a sixth etching process is performed to remove the first passivation layer 86 not covered by the dielectric layer 88 to a surface of the conductive layer 84.

In the second embodiment according to the present invention, an anti-reflecting layer is formed to replace the third dielectric layer in the first embodiment, and a passivation layer used as an etch stop layer is not formed when forming a trench or a via hole in the dielectric layer. Therefore, the dual damascene structure has a bowl-type profile or a stair-type profile, so the filling effect is larger in the subsequent process of filling a metal layer. The disadvantage of metal atoms penetrating the barrier layer and diffusing into the silicon substrate due to bad step coverage in a bottom and side walls of a via hole is prevented, so process yield and the electrical performance of semiconductor products are improved.

In contrast of the prior art method of fabricating a dual damascene structure on the surface of a semiconductor wafer, the present invention first uses a photoresist layer to define patterns of an upper trench and via hole respectively in the dielectric layer and in the passivation layer. In another word, a dual hard mask is first formed, then the dielectric layer and the passivation layer are used as hard masks to perform an etching process for simultaneously forming positions of wiring lines and contact plugs. Therefore, the problem of a residual photoresist layer in the bottom of via hole according to the prior art does not occur, and the metal layer can be completely filled in the via hole in the subsequent process so forming a good dual damascene structure.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a dual damascene structure on a semiconductor wafer, the semiconductor wafer comprising a substrate and a conductive layer positioned on the substrate, the method comprising:

forming a first passivation layer, a first dielectric layer, a second passivation layer, a second dielectric layer, a third passivation layer, a third dielectric layer and a first anti-reflection layer respectively on the semiconductor wafer and covering the conductive layer;

performing a first lithography process to form a first photoresist layer on the first anti-reflecting layer to define a pattern of an upper trench of the dual damascene structure;

performing a first etching process according to the pattern of the first photoresist layer to remove the first anti-reflecting layer and the third dielectric layer not covered by the first photoresist layer to a surface of the third passivation layer;

removing the first photoresist layer and the first anti-reflecting layer;

forming a second anti-reflecting layer on a surface of the semiconductor wafer;

performing a second lithography process to form a second photoresist layer on a second anti-reflecting layer to define the pattern of a via hole of the dual damascene structure;

performing a second etching process according to the pattern of the second photoresist layer to remove the second anti-reflecting layer and the third passivation layer not covered by the second photoresist layer until the surface of the second dielectric layer;

removing the second photdresist layer and the second anti-reflecting layer;

performing a third etching process that uses the third dielectric layer and the third passivation layer as hard masks to remove the second dielectric layer not covered by the third dielectric layer and the third passivation layer until the surface of the second passivation layer;

performing a forth etching process to remove the third passivation layer and the second passivation layer not covered by the third dielectric layer and the second dielectric layer;

performing a fifth etching process that uses the third dielectric layer and the second passivation layer as hard masks to remove the second dielectric layer and the first dielectric layer not covered by the third dielectric layer and the second passivation layer to the surface of the first passivation layer; and performing a sixth etching process to remove the second passivation layer and the first passivation layer not covered by the second dielectric layer and the first dielectric layer to the surface of the conductive layer so completing the process of fabricating the dual damascene structure.

2. The method of claim 1 wherein the conductive layer is a copper conductor.

3. The method of claim 1 wherein each passivation layer is composed of silicon nitride, silicon-oxy-nitride or silicon carbon.

4. The method of claim 1 wherein the first dielectric layer or the second dielectric layer is composed of a low-K material.

5. The method of claim 4 wherein the low-K material comprises a material consistent with parameters of FLARE™, a material consistent with parameters of SiLK™, poly(arylene ether) polymer, parylene compounds, polyimide, fluorinated polyimide, hydrogen silsesquioxane (HSQ), fluorinated silicon glass (FSG), silicon dioxide, nanoporous silica or teflon.

6. The method of claim 1 wherein the third dielectric layer is composed of a silicon oxide and the third passivation layer is composed of silicon nitride.

7. A method of fabricating a dual damascene structure on a semiconductor wafer, the semiconductor wafer comprising a substrate and a conductive layer positioned on the substrate, the method comprising:

forming a first passivation layer, a first dielectric layer, a second passivation layer, a second dielectric layer, a third passivation layer and an anti-reflection layer respectively on the semiconductor wafer and covering above the conductive layer;

performing a first lithography process to form a first photoresist layer on the anti-reflecting layer to define the pattern of an upper trench of the dual damascene structure;

performing a first etching process according to the pattern of the first photoresist layer to remove the anti-reflecting layer not covered by the first photoresist layer to the surface of the third passivation layer;

removing the first photoresist layer;

performing a second lithography process to form a second photoresist layer on the surface of the semiconductor wafer to define the pattern of a via hole of the dual damascene structure;

performing a second etching process according to the pattern of the second photoresist layer to remove the third passivation layer not covered by the second photoresist layer until the surface of the second dielectric layer;

removing the second photoresist layer;

performing a third etching process that uses the anti-reflecting layer and the third passivation layer as hardmasks to remove the second dielectric layer not covered by the anti-reflecting layer and the third passivation layer to the surface of the second passivation layer;

performing a forth etching process to remove the third passivation layer and the second passivation layer not covered by the anti-reflecting layer and the second dielectric layer;

performing a fifth etching process that uses the anti-reflecting layer and the second passivation layer as hard masks to remove the second dielectric layer and the first dielectric layer not covered by the anti-reflecting layer and the second passivation layer until the surface of the first passivation layer; and performing a sixth etching process to remove the second passivation layer and the first passivation layer not covered by the second dielectric layer and the first dielectric layer until the surface of the conductive layer so completing the process of fabricating the dual damascene structure.

8. The method of claim 7 wherein the conductive layer is a copper conductor.

9. The method of claim 7 wherein each passivation layer is composed of silicon nitride or silicon carbon (SiC).

10. The method of claim 7 wherein the anti-reflecting layer is composed of silicon-oxy-nitride, and the third passivation layer is composed of silicon carbon (SiC).

11. The method of claim 7 wherein the first dielectric layer or the second dielectric layer is composed of a low-K material.

12. The method of claim 11 wherein the low-K material comprises a material consistent with parameters of FLARE™, a material consistent with parameters of SiLK™, poly(arylene ether) polymer, parylene compounds, polyimide, fluorinated polyimide, hydrogen silsesquioxane (HSQ), fluorinated silicon glass (FSG), silicon dioxide, nanoporous silica or teflon.

13. A method of fabricating a dual damascene structure on a semiconductor wafer, the semiconductor wafer comprising a substrate and a conductive layer positioned on the substrate, the method comprising:

forming a first passivation layer, a dielectric layer, a second passivation layer and an anti-reflection layer respectively on the semiconductor wafer and covering the conductive layer;

performing a first lithography process to form a first photoresist layer on the anti-reflecting layer to define the pattern of an upper trench of the dual damascene structure;

performing a first etching process according to the pattern of the first photoresist layer to remove the anti-reflecting layer not covered by the first photoresist layer until the surface of the second passivation layer;

removing the first photoresist layer;

performing a second lithography process to form a second photoresist layer on the surface of the semiconductor wafer to define the pattern of a via hole of the dual damascene structure;

performing a second etching process according to the pattern of the second photoresist layer to remove the second passivation layer not covered by the second photoresist layer until the surface of the dielectric layer;

removing the second photoresist layer;

performing a third etching process that uses the anti-reflecting layer and the second passivation layer as hard masks to remove the dielectric layer not covered by the anti-reflecting layer and the second passivation layer until a predetermined depth;

performing a forth etching process to remove the second passivation layer not covered by the anti-reflecting layer;

performing a fifth etching process that uses the anti-reflecting layer as hard mask to remove portions of the dielectric layer not covered by the anti-reflecting layer to the surface of the first passivation layer and forming the dual damascene structure; and performing a sixth etching process to remove the first passivation layer not covered by the dielectric layer to the surface of the conductive layer.

14. The method of claim 13 wherein the conductive layer is a copper conductor.

15. The method of claim 13 wherein each passivation layer is composed of silicon nitride or silicon carbon (SiC).

16. The method of claim 13 wherein the anti-reflecting layer is composed of silicon-oxy-nitride, and the second passivation layer is composed of silicon carbon (SiC).

17. The method of claim 13 wherein the dielectric layer is composed of a low-K material.

18. The method of claim 17 wherein the low-K material comprises a material consistent with parameters of FLARE™, a material consistent with parameters of SiLK™, poly(arylene ether) polymer, parylene compounds, polyimide, fluorinatedpolyimide, hydrogen silsesquioxane (HSQ), fluorinated silicon glass (FSG), silicon dioxide, nanoporous silica or teflon.

* * * * *